(12) United States Patent
Shlomo et al.

(10) Patent No.: US 12,033,703 B2
(45) Date of Patent: Jul. 9, 2024

(54) MULTIBIT MEMORY DEVICE AND METHOD OF OPERATING THE SAME

(71) Applicant: Infineon Technologies LLC, San Jose, CA (US)

(72) Inventors: Oren Shlomo, Haifa (IL); Amichai Givant, Rosh HaAyin (IL); Yair Sofer, Tel Aviv (IL)

(73) Assignee: Infineon Technologies LLC, San Jose, CA (US)

( * ) Notice: Subject to any disclaimer, the term of this patent is extended or adjusted under 35 U.S.C. 154(b) by 0 days.

(21) Appl. No.: 17/497,931

(22) Filed: Oct. 9, 2021

(65) Prior Publication Data

US 2023/0110738 A1 Apr. 13, 2023

(51) Int. Cl.
*G11C 16/28* (2006.01)
*G11C 16/10* (2006.01)
*G11C 16/30* (2006.01)
*G11C 16/34* (2006.01)

(52) U.S. Cl.
CPC ............ *G11C 16/28* (2013.01); *G11C 16/102* (2013.01); *G11C 16/30* (2013.01); *G11C 16/3404* (2013.01)

(58) Field of Classification Search
CPC ....... G11C 16/28; G11C 16/102; G11C 16/30; G11C 16/3404
See application file for complete search history.

(56) References Cited

U.S. PATENT DOCUMENTS

| | | | | |
|---|---|---|---|---|
| 7,372,743 B2* | 5/2008 | Yano | ................... | G11C 16/0475 365/185.02 |
| 7,773,425 B2* | 8/2010 | Takahashi | .......... | G11C 16/0475 365/210.1 |
| 8,259,492 B2* | 9/2012 | Chang | ................. | G11C 16/0475 365/207 |
| 8,686,341 B2* | 4/2014 | Noiret | ................ | H04N 5/35554 250/214 R |
| 8,982,636 B2* | 3/2015 | Chou | ..................... | G11C 16/10 365/208 |
| 2016/0041760 A1* | 2/2016 | Kuang | ................ | G11C 16/3495 711/103 |

* cited by examiner

*Primary Examiner* — Vanthu T Nguyen

(57) ABSTRACT

Memory devices and methods for operating the same are provided. Generally, the device includes an array of multi-bit-memory-cells, each operable to store multiple bits in separate locations of a charge-trapping layer, and control-circuitry coupled to the array. The control-circuitry is operable read 1st and 2nd bit values of each cell individually based on generated first and second sensed currents, where the first and second sensed currents correspond to charges trapped in first and second bit locations. The control-circuitry executes an algorithm based on the first and second sensed currents and determines a logic state of the cell. In one embodiment, the control-circuitry averages the sensed currents, and compares this to a reference current to determine the logic state. In another, the 2nd bit value is a complement of the 1st, and the control-circuitry compares the currents to determine the logic state without use of a reference current.

8 Claims, 14 Drawing Sheets

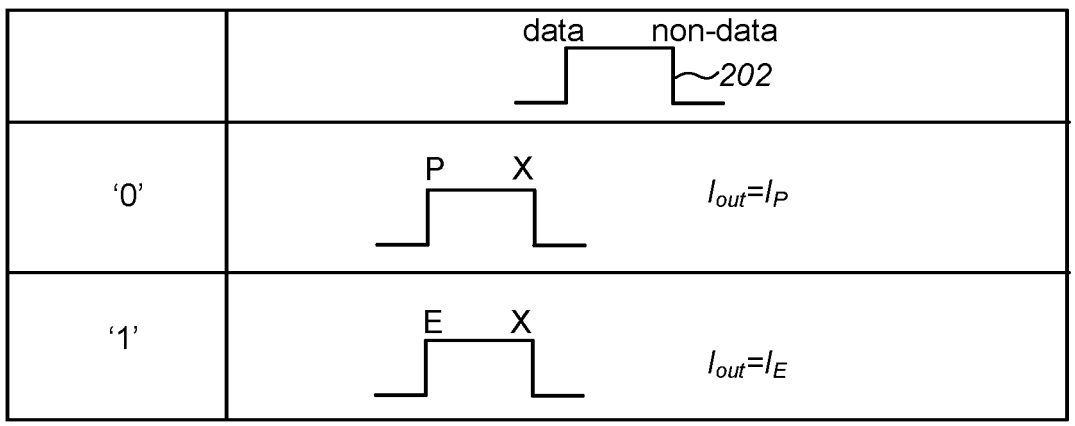
FIG. 2
*(conventional)*

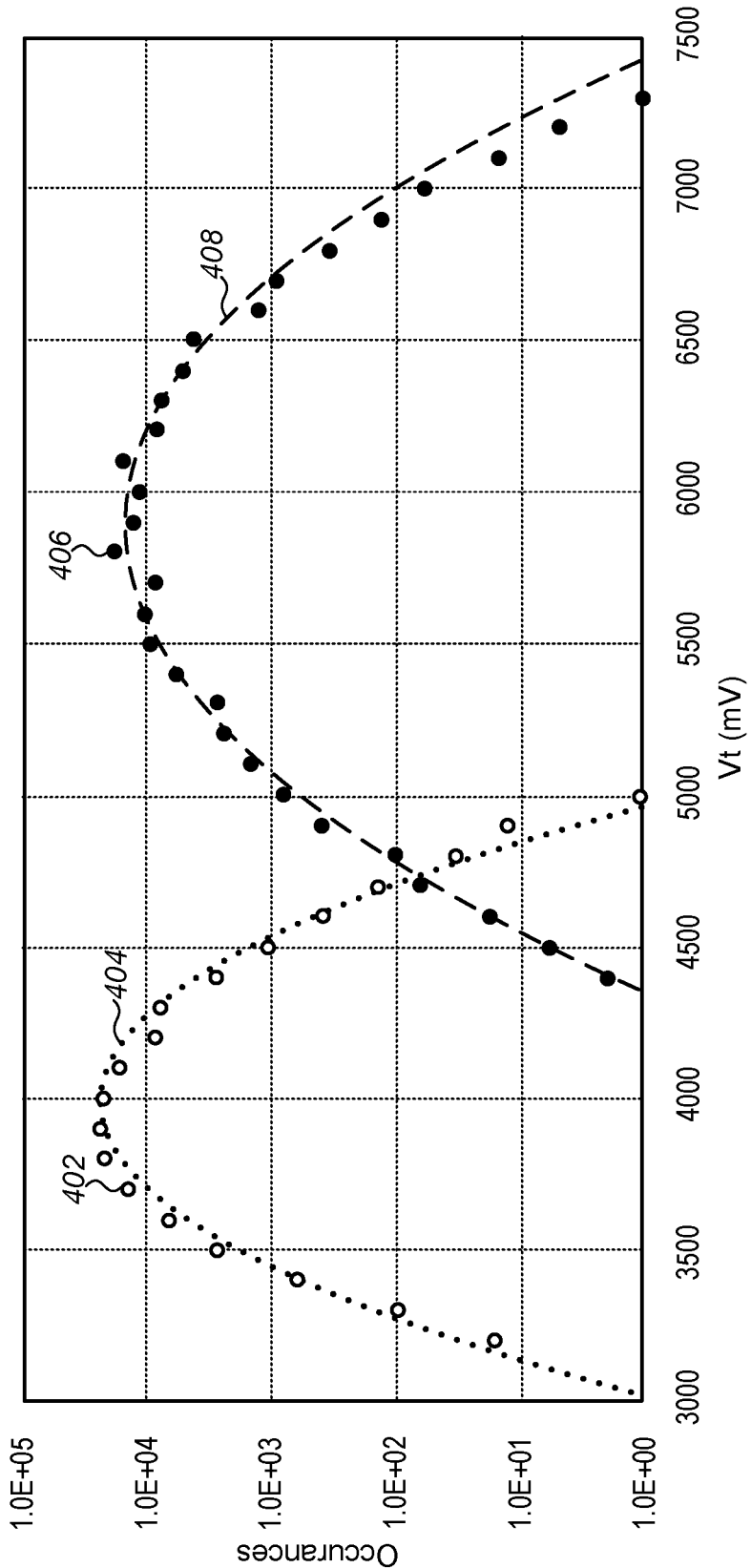
FIG. 4 (conventional)

1002
Sensing a first current from a multibit memory cell resulting from a status of a 1st bit stored in a first bit location in a charge trapping layer of a single transistor in the multibit memory cell and storing a value of the first current

1004
Sensing a second current resulting from a status of a 2nd bit stored in a second bit location in the charge trapping layer and storing a value of the second current

1006
Averaging the first current and the second current to determine an average cell current

1008
Comparing the average cell current to a reference current to read one bit of data from the memory cell

*FIG. 10*

1102
Sensing a first current from a multibit memory cell resulting from a status of a 1st bit stored in a first bit location in a charge trapping layer of a single transistor in the multibit memory cell and storing a value of the first current

1104
Sensing a second current resulting from a status of a 2nd bit stored in a second bit location in the charge trapping layer and storing a value of the second current

1106
Comparing the first current and the second current to read one bit of data from the multibit memory cell based on a difference between the first current and the second current

*FIG. 11*

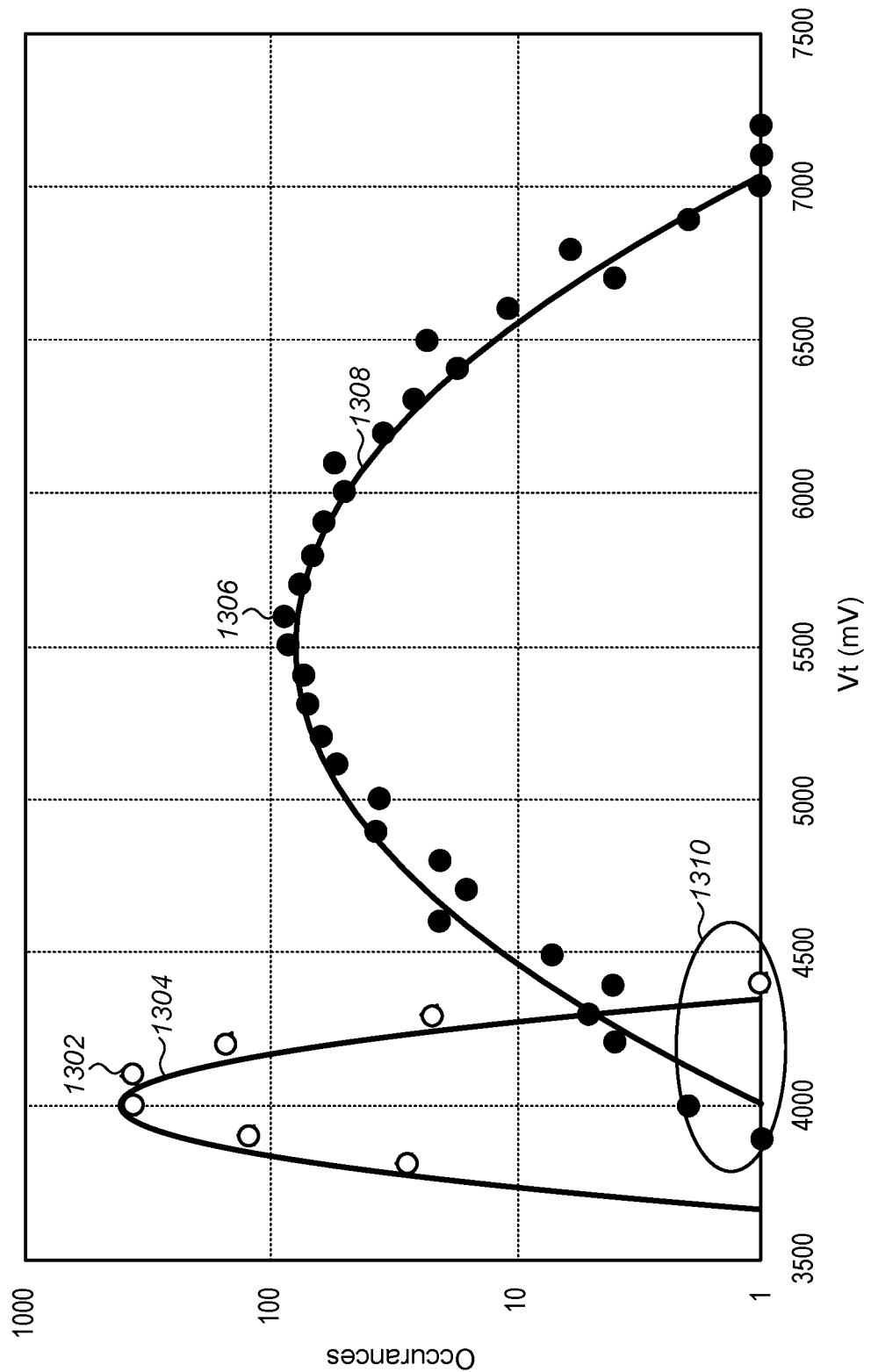
FIG. 13 (Conventional)

MULTIBIT MEMORY DEVICE AND METHOD OF OPERATING THE SAME

TECHNICAL FIELD

This present disclosure relates generally to semiconductor memory devices, and more particularly to multibit memory devices and methods for operating the same to provide high reliability and improved data retention.

BACKGROUND

Non-volatile memory devices are widely used in electronic devices requiring the retention of information when electrical power is terminated. Non-volatile memory devices include memory transistors using a floating-gate or charge-trapping technology.

A multibit memory device is one including multibit memory cells each capable of storing multiple bits in a single charge-trapping non-volatile memory transistor. One particular type of multibit memory cell is a MirrorBit® (hereinafter "MirrorBit", of Cypress Semiconductor Corp. of San Jose, California), cell in which a NOR architecture of the memory array and the non-conducting nature of a charge-trapping nitride layer allows a single transistor to store two spatially separated physical bits of data per cell (2BPC) of the same device. Referring to FIG. 1, a MirrorBit cell 100 generally includes a charge-trapping gate stack 102 including a control gate 104, a top or blocking dielectric layer 106, a charge-trapping layer 108, and a bottom dielectric layer 110, formed over a channel 112 separating first and second source-drain (S/D) regions 114a, 114b, in a substrate 116. Through proper biasing the MirrorBit cell 100 can store two spatially separated physical bits (bit1 and bit2) as charges at opposite ends of the charge-trapping nitride layer 108. These two independent physical bits (bit1 and bit2) can be independently read by running a current through the channel 112 in different directions, or other read/sensing algorithms known by one having ordinary skill in the art.

One problem with conventional MirrorBit multibit memory cells is that at higher densities, i.e., smaller transistor architectures, and/or as the devices age cross interaction between spatially separated physical bits in the same physical charge-trapping layer, referred as Complementary Bit Disturb (CBD) will lead to a reliability loss in the information stored in the multibit memory cells in case that those spatially separated physical bits are storing different bit values or amounts of charge. CBD has proven to be especially problematic as the memory devices age and approach end of life (EOL) due to shifts in threshold voltage (Vt) of the memory transistors and accumulation of damage to their charge-trapping layers.

Previous approaches to address CBD where higher reliability is required have focused on restricting multibit memory cells to lower density memory devices with physically larger transistors with greater separation between the physical bits stored in the same charge-trapping layer, and/or operating the multibit memory cell in a 1-Bit-Per-Cell (1BPC) configuration. In a 1BPC configuration the spatially separated physical bits in the same physical charge-trapping layer have the same stored value (to avoid CBD), but reading is done only on one of the physical bits. The other physical bits are not read and are considered non-data bits. However, the above measures have not enough to sufficiently improve reliability, and/or have resulted in significant costs and area penalties for 1BPC configuration.

Accordingly there is a need for an improved multibit memory device including multibit memory cells and method of operating the same to provide increased reliability at higher circuit densities.

SUMMARY

Multibit memory devices and methods for operating the same are provided. Generally, the memory device includes an array of multibit memory cells, each operable to store bit values of multiple physical bits, each bit value is stored in a separate physical bit location of a shared charge-trapping layer of a single transistor in a multibit memory cell, and control-circuitry coupled to the array of multibit memory cells. The control-circuitry is operable to read a 1st bit value and a 2nd bit value of one multibit memory cell individually based on generated first and second sensed currents, wherein the first and second sensed currents correlate or correspond to a charge trapped in first and second physical bit locations respectively. The control-circuitry if further operable to perform an algorithm on the first and second sensed currents, and determine a logic state of the one multibit memory cell based on a result of the algorithm.

In one sensing approach the control-circuitry is configured to average sensed currents from the $1^{st}$ bit and a second bit $2^{nd}$ bit to obtain an average cell current, and to compare the average cell current to a reference current to read the one bit of data from the multibit memory cell. In one embodiment, this averaging sensing approach is accomplished using a processor in the control-circuitry configured to sequentially sense and store the first current from the $1^{st}$ bit, and then a second current from the $2^{nd}$ bit. The processor then calculates the average cell current and compares the result to the reference current to read the cell. In another embodiment, the control-circuitry further includes a current-to-voltage (I-V) converter, a number of capacitors coupled to the I-V converter, an averaging circuit coupled to the capacitors, and a comparator coupled to the averaging circuit. The I-V converter converts the first current from the $1^{st}$ bit to a first voltage, and the second current from the $2^{nd}$ bit to a second voltage. The capacitors include at least a first capacitor to store the first voltage and a second capacitor to store the second voltage. The averaging circuit outputs the average cell current, and the comparator compares it to reference current to read the multibit memory cell.

In another sensing approach the control-circuitry is configured to store a first bit value in the $1^{st}$ bit and a complement of the first bit value in the $2^{nd}$ bit, and to compare the first current and the second to read data from the cell without a reference current. In one embodiment, this differential sensing approach is accomplished using a processor in the control-circuitry configured to sequentially sense and store the first current from the $1^{st}$ bit, and then a second current from the $2^{nd}$ bit. The processor compares the first current and the second, and reads the one bit of data from the multibit memory cell based on a difference between the first current and the second current. In another embodiment, the control-circuitry further includes an I-V converter, capacitors coupled to the I-V converter, and a comparator coupled to the capacitors. The I-V converter converts the first current from the $1^{st}$ bit to a first voltage, and the second current from the $2^{nd}$ bit to a second voltage. The capacitors store the first and second voltages, and the comparator compares the voltages against each other to read the multibit memory cell based on the difference between the first current and the second current. Thus, the differential sensing approach will result in a significant savings in area and cost of the device.

In yet another sensing approach the memory device is operated using either a maximum (Max) threshold voltage (Vt) sensing approach or a minimum Vt sensing approach. Briefly, the decision to use either the Max Vt or the Min Vt approach is determined a-priori by early characterization of the multibit memory cell(s) of the memory device. If the 'erased' Vt distribution for the physical bits of the cell is narrower than the 'programmed' Vt distribution, a Max Vt sensing approach is used, in which a $1^{st}$ bit and a $2^{nd}$ bit are sensed taking the higher Vt result as output for the cell. Conversely, if the 'programmed' Vt distribution for the physical bits of the cell is narrower than the 'erased' Vt distribution, a Min Vt sensing approach is used, in which the $1^{st}$ bit and $2^{nd}$ bit are sensed taking the lower Vt result as output for the cell.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 2 (conventional) is a schematic diagram illustrating a single multibit memory cell showing the output for a programmed and an erased cell when operated in a conventional sensing approach using only one of multiple charge-trapping locations to store one bit of data per cell (1BPC);

FIG. 4 (conventional) is a graph illustrating threshold voltage distributions near end-of-life (EOL) for a number of multibit memory cells operated in a conventional sensing approach using a single charge-trapping location to store one bit per cell;

FIG. 10 is a flowchart illustrating a method of operating a multibit memory device in an averaging sensing approach using multiple charge-trapping locations to store one bit per cell in accordance with an exemplary algorithm of the present disclosure;

FIG. 11 is a flowchart illustrating a method of operating a multibit memory device in a differential sensing approach using multiple charge-trapping locations to store one bit per cell in accordance with an exemplary algorithm of the present disclosure;

FIG. 13 (conventional) is a graph of simulated erased and programmed distributions of a number of multibit memory cells operated in a conventional sensing approach in which a single charge-trapping location is used to store one bit per cell;

DETAILED DESCRIPTION

Figure 1:
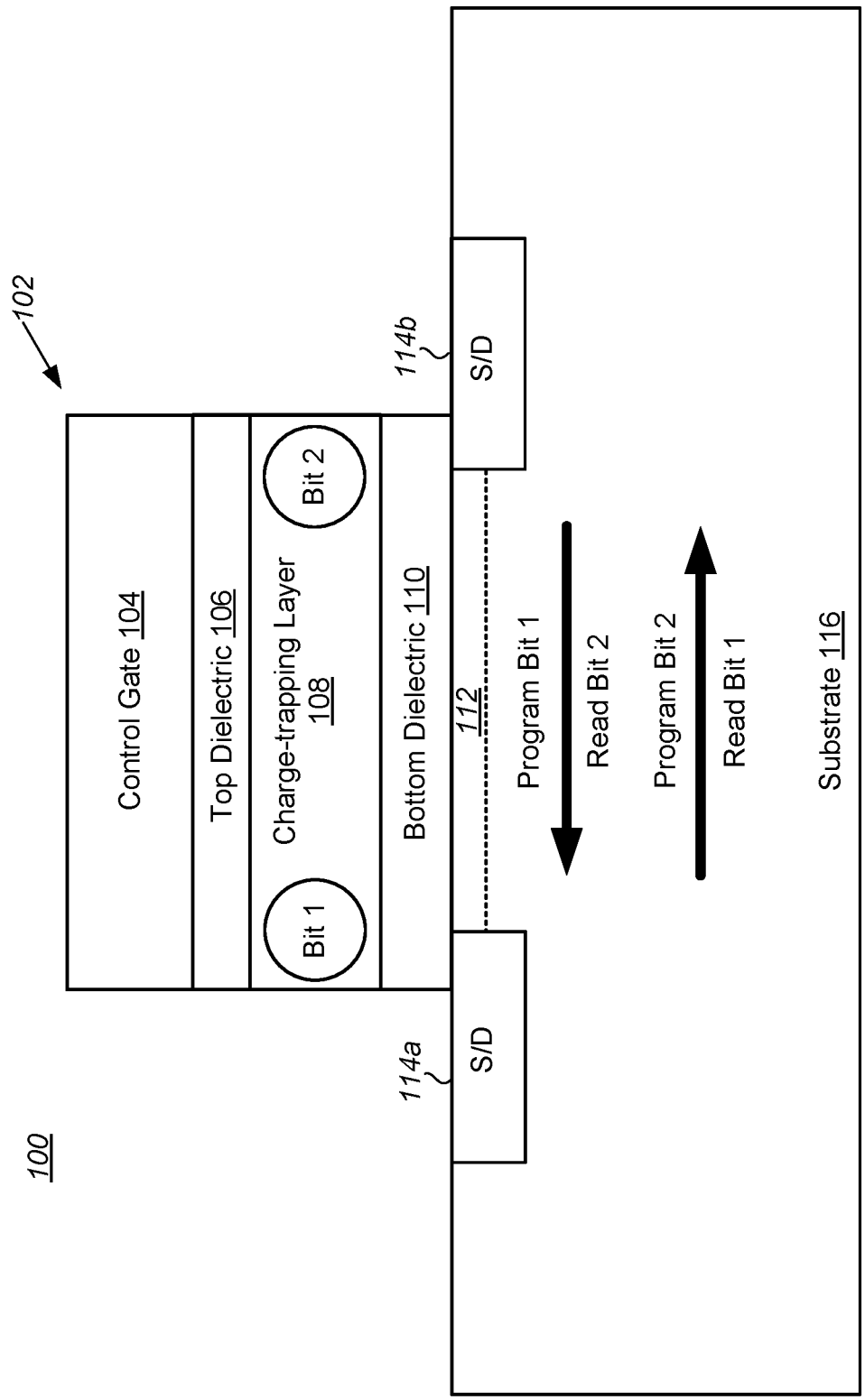
FIG. 1 is a block diagram illustrating one embodiment of a charge-trapping transistor of a single multibit memory cell for which the circuits and method of the present disclosure is particularly useful.

Multibit memory devices and methods for operating the same method of operating the same to provide high reliability and improved data retention are disclosed.

In the following description, for purposes of explanation, numerous specific details are set forth in order to provide a thorough understanding of the present invention. It will be evident, however, to one skilled in the art that the present invention can be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein can include both to directly electrically connect two or more components or elements and to indirectly connect through one or more intervening components.

Briefly, the multibit memory devices and method for operating the same involves using physical bits store in at least two separate bit locations of a shared charge-trapping layer of a memory transistor in a single multibit memory cell to store a single data bit with improved reliability. In one embodiment, a first current from the multibit memory cell resulting from and corresponding to charge trapped in first bit location and a second current corresponding to a charge trapped in second bit location are sequentially sensed and stored. The first and second currents are then averaged and the resulting average cell current compared with a reference current to determine a status or logic state of the data bit of the one multibit memory cell. In another embodiment, the status or logic state of the data bit of the one multibit memory cell is determined by obtaining a difference between the first and second current.

Further details of these and other embodiments will now be described with reference to FIGS. 2 through 16.

FIG. 2 is a schematic diagram illustrating a single multibit memory cell 202 showing the output for a programmed and an erased cell when operated in a conventional sensing approach using only one of the multiple charge-trapping locations in a shared charge-trapping layer of a single transistor in the memory cell to store a one bit of data. Referring to FIG. 2 it is noted that the same bit, i.e., a '0' for a programmed bit or '1' for an erased bit is stored in both of two multiple charge-trapping locations, shown here as a 'data bit' and a 'non-data bit.' Using this conventional 1-Bit-Per-Cell (1BPC) configuration, one bit is considered a data bit and the other, a 'non-data' bit that is written same as data bit but not read. As shown in FIG. 2 although both the data bit and the non-data bit are programmed with a '0' only the data bit is read during a read operation, note the non-data bit as indicated by an 'X', so that an output current, $I_{out}$, read from the multibit memory cell 202 is equal to a current, $I_P$, read from the data bit. Similarly, when the charge trapped at both the data bit and non-data bit locations are erased, a '1' is read only from the data bit during the read operation, so that $I_{out}$ is equal to a current, $I_E$, from the data bit. It will be the understanding that, throughout this document, the allocation of a programmed state="0" and an erased state="1" is only exemplary. In some embodiments, the opposite allocation may be adopted.

This approach seeks to avoid Complementary Bit Disturb (CBD) and a $2^{nd}$ bit margin loss by not allowing '10/01' checkerboard configuration in which complementary (non-data) bit is programmed to be opposite relative to the data bit of same cell. This conventional 1BPC sensing approach does provide an increase in reliability relative to a two bit per cell (2BPC) sensing approach, however the conventional 1BPC sensing approach significantly reduces data capacity per multibit memory cell and limits memory device densities.

Figure 3:
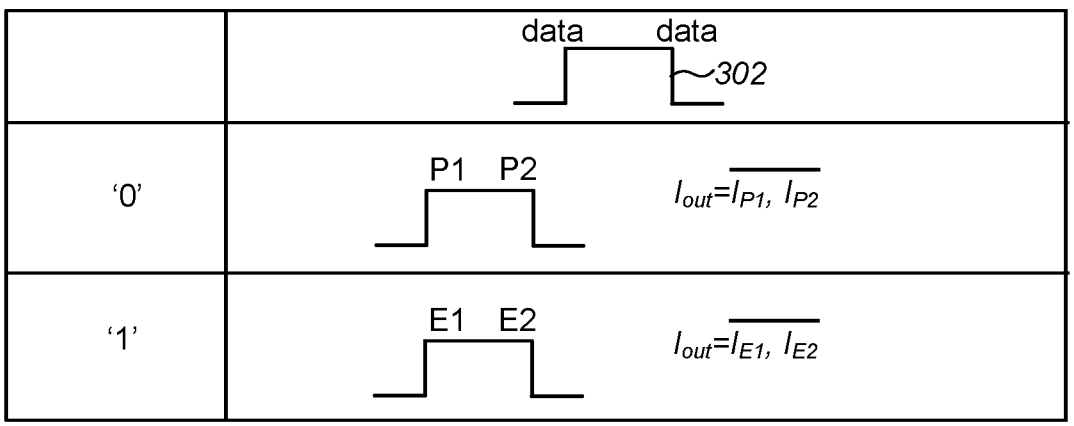
FIG. 3 is a schematic diagram illustrating a single multibit memory cell showing the output for a programmed and an erased cell when operated in an averaging sensing approach using multiple charge-trapping locations to store one bit of data in accordance with exemplary embodiments of the present disclosure.

FIG. 3 is a schematic diagram illustrating a single multibit memory cell 302 showing the output for a programmed and an erased cell when operated in an averaging sensing approach using multiple charge-trapping locations to store a one bit of data in accordance with exemplary embodiments of the present disclosure. Referring to FIG. 3 it is seen that both locations of the multibit memory cell 302 store data bits, so that both data bits are programmed with a '0', P1, P2, and during a read operation both data bits are read so that the output current, $I_{out}$, from the multibit memory cell 302 is equal to an average of $I_{P1}$ and $I_{P2}$ or $I_{out}=\overline{IP1,IP2}$. Similarly, when the charge trapped at both data bit locations is erased, a '1' is read from both data bits and averaged so that $I_{out}$ is equal to an average of $I_{E1}$ and $I_{E2}$ or $I_{out}=\overline{IE1,IE2}$.

It is noted that the above averaging sensing approach can be extended to multibit memory cells having more than two separate physical bit locations 1 through n such that an average programmed current out is given by $I_{out}=\overline{IP1,IP2,IP3,...IPn}$, and the average erased current is given by $I_{out}=\overline{IE1,IE2,IE3IEn}$.

FIG. 4 is a graph illustrating threshold voltage distributions for a number of multibit memory cells that have been cycled and baked to simulate near end-of-life (EOL) conditions, and are operated in a conventional 1BPC sensing approach using data and non-data bits and reading a single charge-trapping location to store one bit per cell (see FIG. 2). Open circles 402 represent Vt for erased multibit memory cells, and curve 404 is fit to these erased data points. Filled circles 406 represent Vt for programmed multibit memory cells, and curve 408 is fit to these programmed data points. Referring to FIG. 4, it is noted that threshold voltages for erased multibit memory cells (open circles 402) and programmed multibit memory cells (filled circles 406) begin to overlap with over about 100 occurrences at a threshold voltage (Vt) of about 4600 mV, indicating that data read from the multibit memory cells cannot be considered reliable, i.e., a false read.

Figure 5:
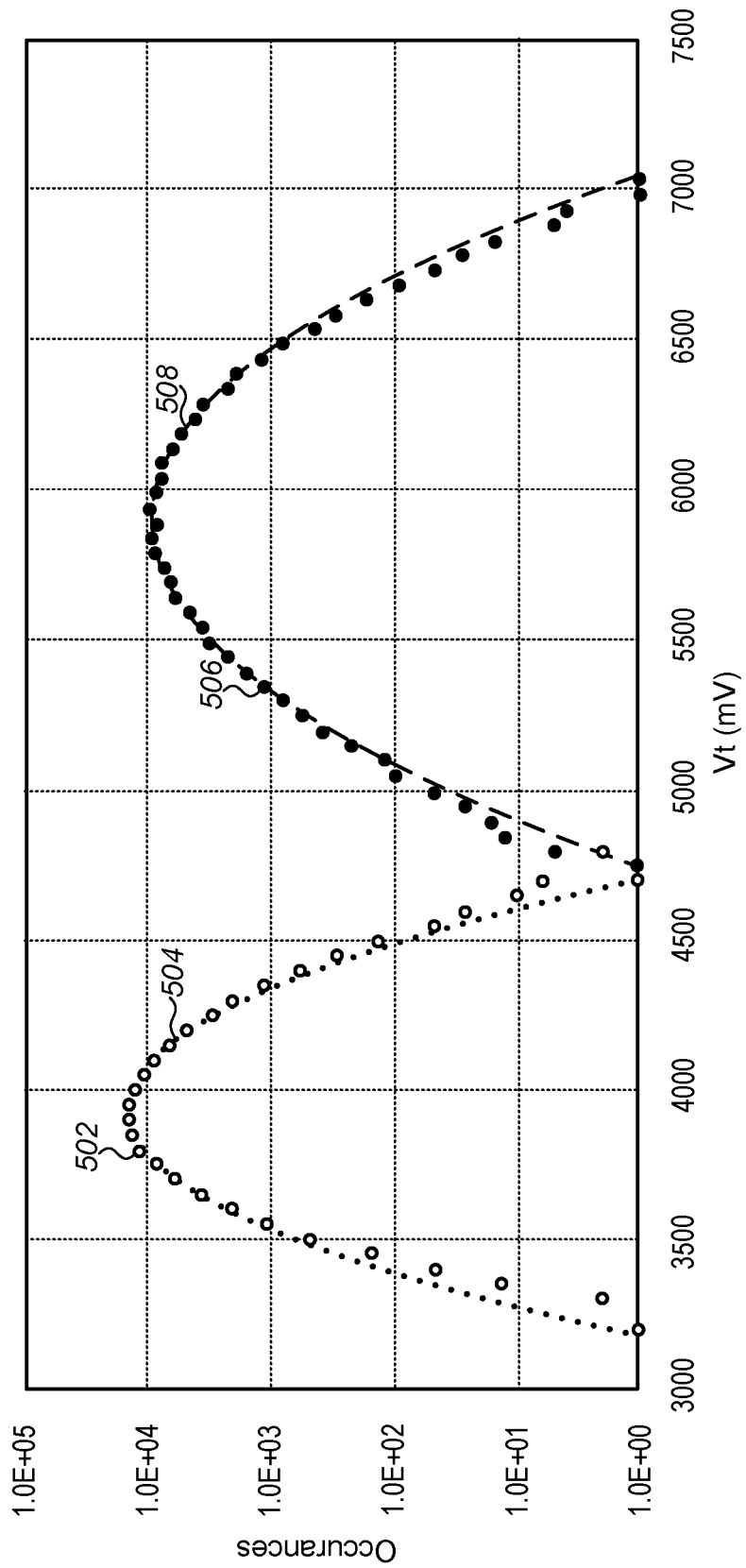
FIG. 5 is a graph illustrating an improvement in threshold voltage distributions near EOL for a number of multibit memory cells operated in an averaging sensing approach using multiple charge-trapping locations to store one bit per cell in accordance with exemplary embodiments of the present disclosure.

FIG. 5 is a graph illustrating an improvement in threshold voltage distributions for a number of multibit memory cells operated in an averaging sensing approach using multiple charge-trapping locations to store one bit per cell in accordance with exemplary embodiments of the present disclosure. The multibit memory cells from which the graph of FIG. 5 is derived have been similarly cycled and baked to simulate near EOL conditions. As in FIG. 4, open circles 502 represent Vt for erased multibit memory cells, and curve 504 is fit to these erased data points, and filled circles 506 represent Vt for programmed multibit memory cells, and curve 508 is fit to these programmed data points. Referring to FIG. 5, it is noted that threshold voltages for erased multibit memory cells (open circles 502) and programmed multibit memory cells (filled circles 506) overlap with only about 1 occurrence at the same threshold voltage (Vt) of about 4600 mV, indicating an improvement of reliability near EOL looks of about 2 orders of magnitude over the conventional 1BPC when operated in an averaging sensing approach using multiple charge-trapping locations to store one bit per cell in accordance with exemplary embodiments of the present disclosure.

Figure 6:
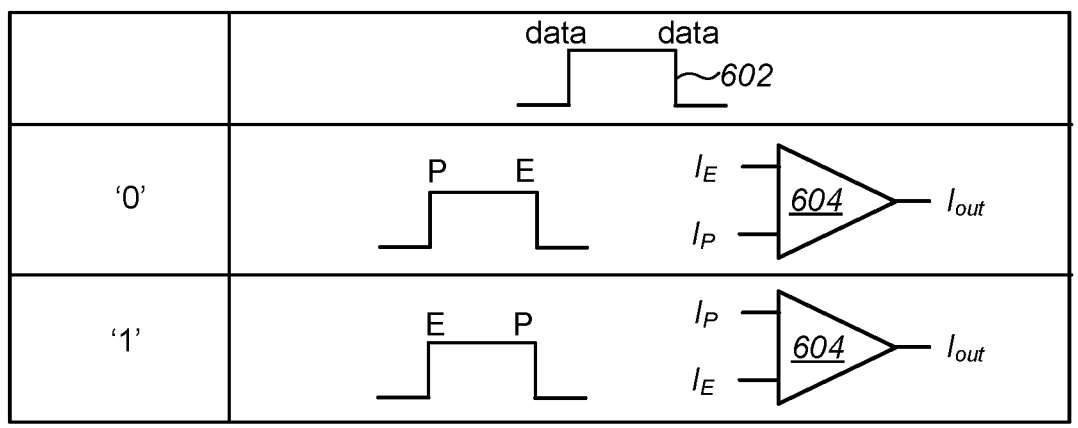
FIG. 6 is a schematic diagram illustrating a single multibit memory cell showing the output for a programmed and an erased cell when operated in a comparing or differential sensing approach using multiple charge-trapping locations to store a data bit and its complement in accordance with exemplary embodiments of the present disclosure.

FIG. 6 is a schematic diagrams illustrating a single multibit memory cell showing the output for a programmed and an erased cell when operated in a comparing or differential sensing approach using multiple charge-trapping locations to store a data bit and its complement in accordance with exemplary embodiments of the present disclosure. Referring to FIG. 6 it is seen that both locations of the multibit memory cell 602 store data bits, however in this embodiment a bit value of a second data bit ($2^{nd}$ bit) on the right hand side of FIG. 6 is a complement of the bit value of a first bit ($1^{st}$ bit) on the left hand side of FIG. 6. Thus, when the multibit memory cell 602 is programmed to store a '0' the $1^{st}$ bit has a bit value of '0' or P, the $2^{nd}$ bit has a bit value of '1' or E, and the output current, $I_{out}$, from the multibit memory cell 602 is determined by comparing or subtracting the current $I_P$ produced by the $1^{St}$ bit from the current produced by the $2^{nd}$ bit using a differential comparator 604. Similarly, when the $1^{st}$ bit has a bit value of '1' or E, the $2^{nd}$ bit has a bit value of '0' or P, the output current, $I_{out}$, is determined by comparing or subtracting the current $I_E$ from $I_P$, and the multibit memory cell 602 is programmed to store a '1.'

Figure 7:
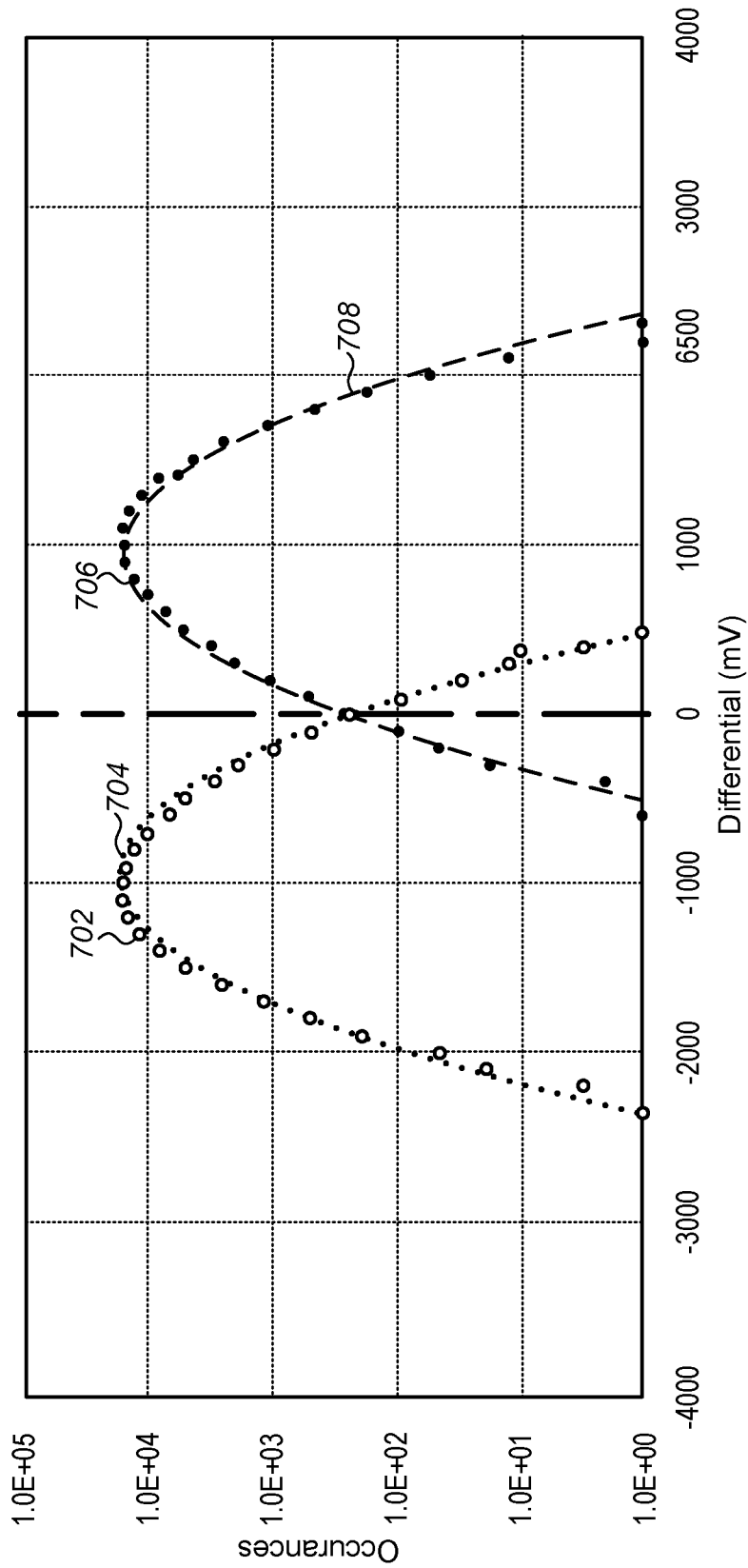
FIG. 7 is a graph illustrating differential threshold voltage distributions near EOL for a number of multibit memory cells operated in a differential sensing approach using multiple charge-trapping locations to store a data bit and its complement in accordance with exemplary embodiments of the present disclosure.

FIG. 7 is a graph illustrating differential threshold voltage (delta-Vt: Vt of $2^{nd}$ bit subtracted from Vt of $1^{St}$ bit) distributions near EOL for a number of multibit memory cells operated in a differential sensing approach using multiple charge-trapping locations to store a data bit and its complement in accordance with exemplary embodiments of the present disclosure. The vertical or y-axis represents a number of occurrences of a particular Delta-Vt while the horizontal or x-axis shows subtraction of right bit Vt from left bit Vt. Open circles 702 represent Delta-Vt for multibit memory cells in an erased or $1^{st}$ state, and curve 704 is fit to these $1^{st}$ state data points, and filled circles 706 represent Delta-Vt for multibit memory cells in a programmed or $2^{nd}$ state, and curve 708 is fit to these $2^{nd}$ state data points. Referring to FIG. 7, it is noted that beginning of life (BOL) reliability is improved while EOL reliability is comparable to the conventional 1BPC embodiment seen in FIG. 4 without the use of reference circuitry. Thus, the differential sensing approach will result in a significant savings in area and cost of the device.

Figure 8:
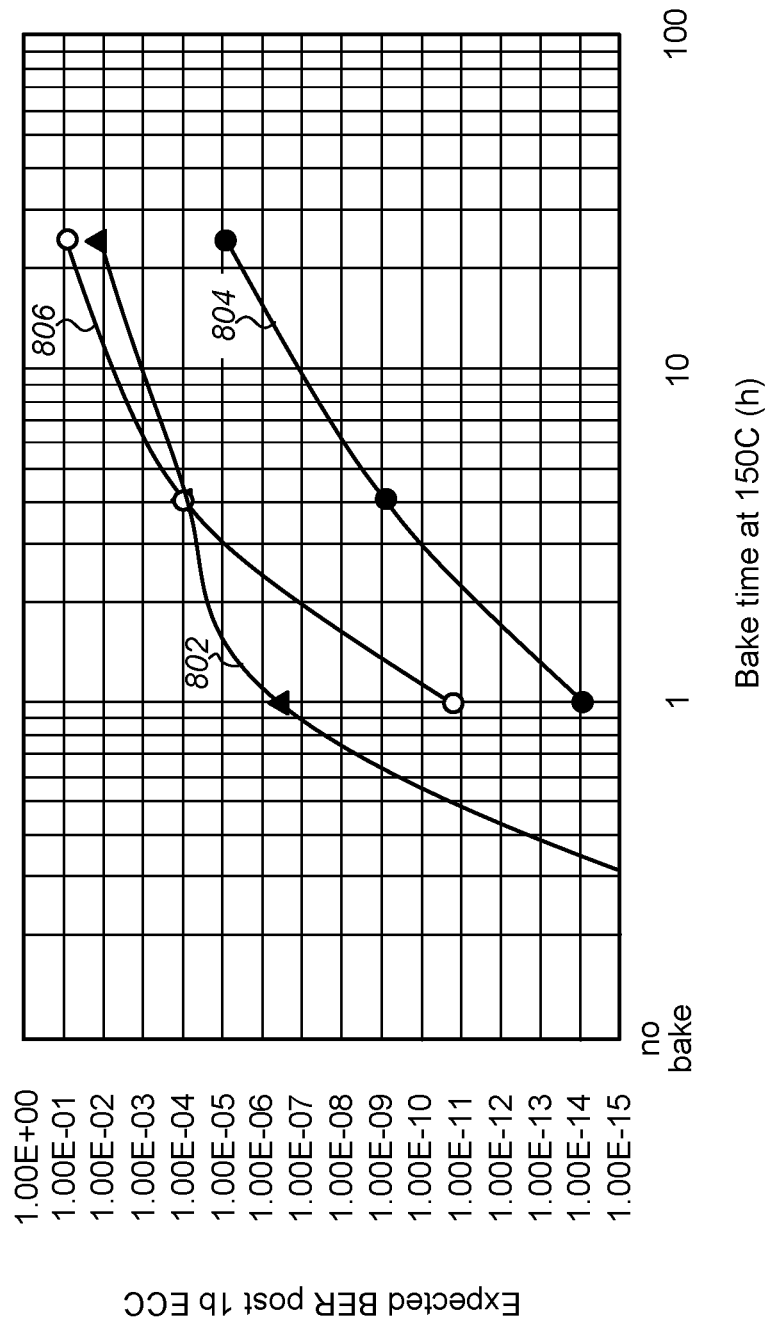
FIG. 8 is a graph comparing Bit Error Rates (BER) for conventional, averaging and differential sensing approaches for operating a number of multibit memory cells to store one bit per cell.

FIG. 8 is a graph comparing Bit Error Rates (BER) for conventional 1BPC sensing approach 802, an averaging sensing approach 804 and a differential sensing approach 806 for operating a number of multibit memory cells to store one bit per cell. Referring to FIG. 8 it is noted the averaging sensing approach 804 provides the greatest improvement in BER and therefore reliability as compared to the conventional 1BPC sensing approach 802. It is further noted that the differential sensing approach 806 has BER and reliability at EOL comparable to the conventional 1BPC sensing approach 802, while providing further advantages due to the elimination of a reference requirement (Vref) to read the multibit memory cells.

Figure 9:
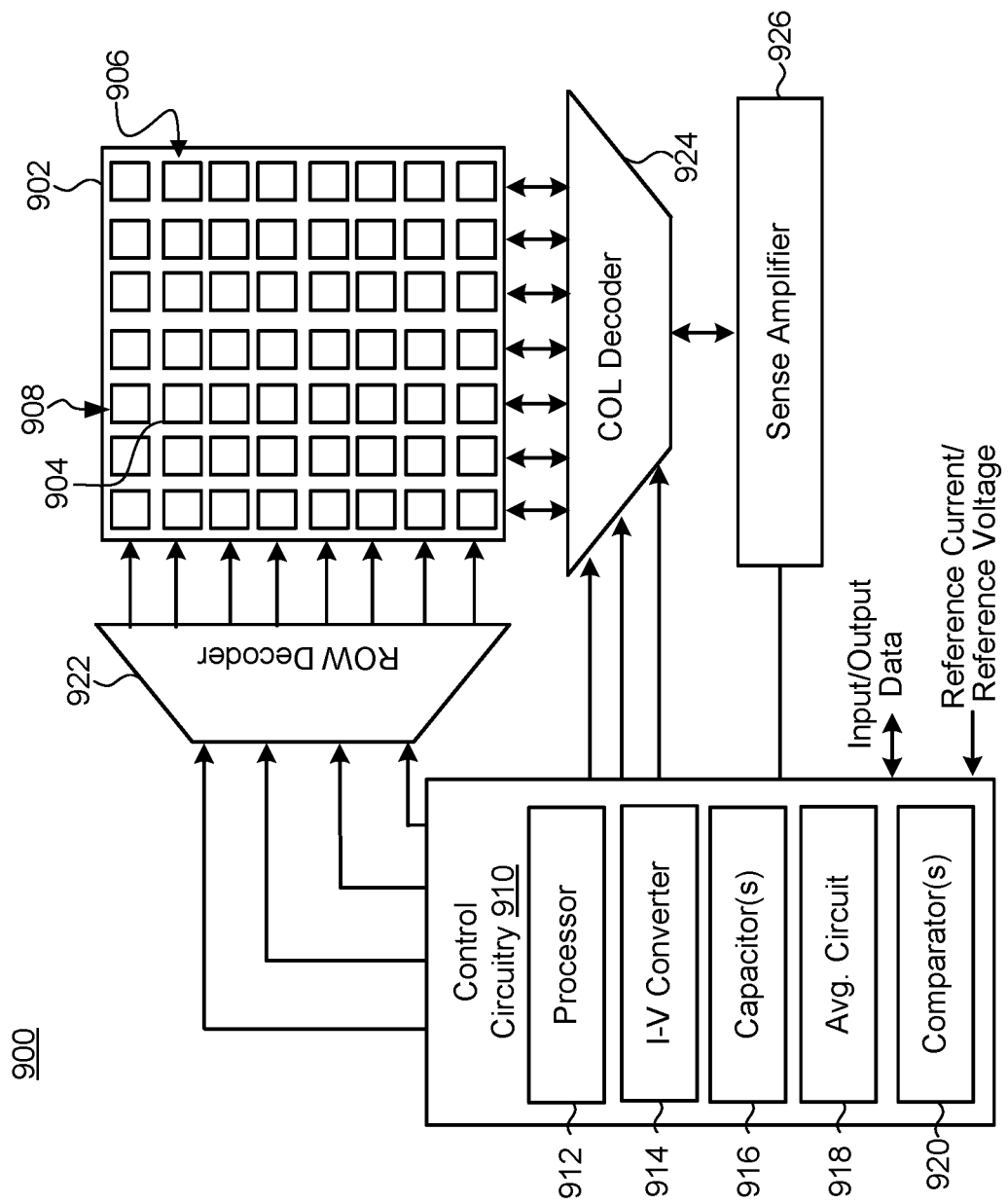
FIG. 9 is a block diagram of a multibit memory device including control-circuitry operable to store and read data from an array of multibit memory cells using a differential sensing approach, an averaging sensing approach and/or a minimum-maximum Vt (threshold voltage) as described herein.

FIG. 9 is a block diagram of a multibit memory device including control-circuitry operable to store and read data from an array of multibit memory cells using a differential sensing approach and/or an averaging sensing approach. Referring to FIG. 9 the memory device 900 includes an array 902 of multibit memory cells 904 arranged in a number of rows 906 and columns 908, and control-circuitry 910 to control each of the multibit memory cells to perform programming, erase and read operations. Generally, as in the embodiment shown in FIG. 9, the control-circuitry 910 includes a processing element or processor 912, a current-to-voltage (I-V) converter 914, a number of storage elements or capacitors 916, an averaging circuit 918 and one or more voltage and/or current comparators 920. The memory device 900 further includes a row decoder 922 and a column decoder 924 to select multibit memory cells 904 in the array 902 for programming, erase and read operations, and a number of sense amplifiers 926 coupled to each multibit memory cell to sense currents from each of the multiple bits stored in separate locations of the shared charge-trapping layer.

In accordance with the present disclosure, the processor 912 is configured or operable to sense and store a first current and second currents from at least a $1^{st}$ bit and $2^{nd}$ bit multibit memory cell 904 and to determine the logic state of the multibit memory cell 904. In one embodiment, where an averaging sensing approach is used the processor 912 is configured or operable to calculate an average cell current from the first and second currents, and to compare the average cell current to a reference current to read the one bit of data from the multibit memory cell 904. In another embodiment, where a differential sensing approach is used the processor 912 is further configured or operable to subtract the first current from the $1^{st}$ bit from the second current from the $2^{nd}$ bit to read the one bit of data from each multibit memory cell based on a difference between the first current and the second current.

The I-V converter 914 is coupled to the sense amplifiers 926 and is configured or operable to convert a first current from the $1^{st}$ bit to a first voltage, and a second current from the $2^{nd}$ bit to a second voltage for storage as a charge in the capacitors 916 or as voltage level in the processor 912.

The capacitors 916 are coupled to the I-V converter 914 and include at least a first capacitor configured or operable to store the first voltage and a second capacitor operable to store the second voltage from the I-V converter.

The averaging circuit 918, where included, is coupled to the number of capacitors 916 and is configured or operable to output an average cell voltage (which corresponds to the average cell current), based on the first voltage and the second voltage.

Where the averaging sensing approach is used the comparators 920 include at least one voltage comparator coupled to the averaging circuit 918 and to a reference voltage, the voltage comparator configured or operable to compare the averaged voltage to a reference voltage to read the averaged one bit of data from each multibit memory cell.

Where the differential sensing approach is used the comparators 920 include at least one voltage comparator coupled to the number of capacitors 916 configured or operable to compare the first voltage stored on the first capacitor and the second voltage stored on the second capacitor, and to read the one bit of data from each multibit memory cell based on the difference between the first current and the second current, without use of a reference current.

FIG. 10 is a flowchart illustrating an algorithm and method of operating a memory device, such as that shown in FIG. 9, including multibit memory cells using an averaging sensing approach. Referring to FIG. 10 the method begins with sequentially sensing a first current from a multibit memory cell resulting from a status (programmed or erased) of a stored bit or amount of charge in a first bit location ($1^{st}$ bit) in a charge-trapping layer of the cell and storing a value of the first current (1002), followed by sensing a second current from the multibit memory cell resulting from the status (programmed or erased) of a bit or amount of charge stored in a second bit location ($2^{nd}$ bit) and storing a value of the second current (1004). Next, the first current and the second current are averaged to determine an average cell current (1006). Finally, the average cell current is compared to a reference current (Iref) to (determine the status or logic state of the entire cell) read one bit of data from the multibit memory cell (1008). The sensing of the first and second currents, averaging and comparing the average cell current to the reference current can be accomplished using a processor in the control-circuitry to sequentially sense and store the first and second currents, calculate the average cell current and to compare the result to the reference current to read the cell.

Alternatively, as described above the control-circuitry may further include a current-to-voltage (I-V) converter, a number of capacitors coupled to the I-V converter, an averaging circuit coupled to the capacitors, and a comparator coupled to the averaging circuit, and the logic state of the multibit memory cell is determined using control-circuitry. The I-V converter converts the first current from the $1^{st}$ bit to a first voltage, and the second current from the $2^{nd}$ bit to a second voltage. The capacitors include at least a first capacitor to store the first voltage and a second capacitor to store the second voltage. The averaging circuit outputs the average cell voltage stored in the capacitors, and the comparator compares it to reference voltage to read the multibit memory cell.

FIG. 11 is a flowchart illustrating an algorithm and method of operating a memory device including multibit memory cells using a differential sensing approach. Referring to FIG. 11 the method begins with sequentially sensing a first current from a multibit memory cell resulting from a status (programmed or erased) of a stored bit or amount of charge in a first bit location ($1^{st}$ bit) in a charge-trapping layer of the cell and storing a value of the first current (1102), followed by sensing a second current from the multibit memory cell resulting from the status (programmed or erased) of a bit or amount of charge stored in a second bit location ($2^{nd}$ bit) and storing a value of the second current (1104). As noted above the $2^{nd}$ bit is a complement of the $1^{st}$ bit. Next, the first current is compared with the second current to determine the status or logic state of the cell based on a difference between the first current and the second current, without use of a reference current (1106). The sensing of the first and second currents can be accomplished using a processor in the control-circuitry to sequentially sense and store the first current from the $1^{st}$ bit, and then a second current from the bit $2^{nd}$ bit. The processor compares or subtracts the first current from the second, and reads the one bit of data from the multibit memory cell based on a difference between the first current and the second current.

Alternatively, as described above the control-circuitry may further include an I-V converter, capacitors coupled to the I-V converter, and a comparator coupled to the capacitors, and the logic state of the multibit memory cell is determined using control-circuitry. The I-V converter converts the first current from the $1^{st}$ bit to a first voltage, and the second current from the $2^{nd}$ bit to a second voltage. The capacitors store the first and second voltages, and the comparator compares the first voltage against the second voltage to read the multibit memory cell based on the difference between the first voltage and the second voltage, which corresponds to the current difference of the two bits, respectively.

Another method for operating a memory device including multibit memory cells using a maximum threshold voltage (max Vt) and/or minimum Vt (min Vt) sensing approach, referred to herein as a Min-Max Vt sensing approach, will now be described with reference to FIGS. 12A through 16.

Figure 12A:
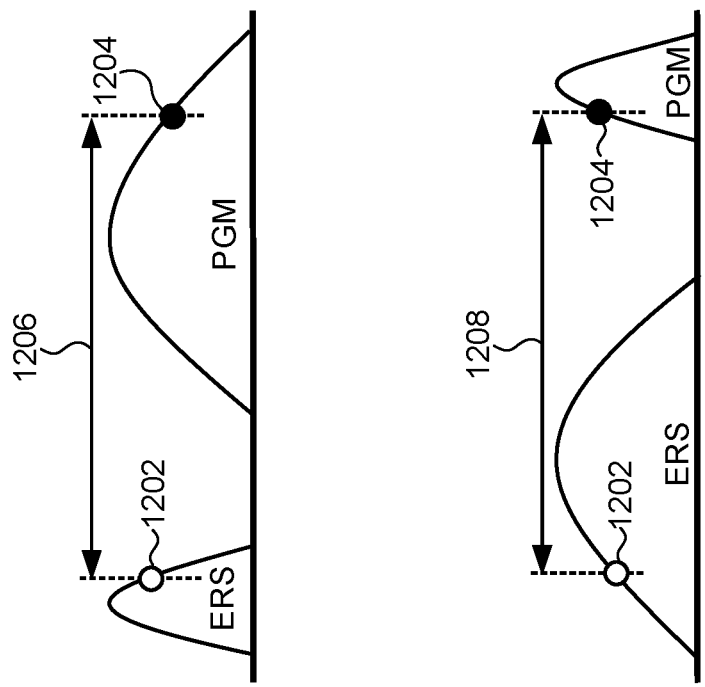
FIGS. 12A and 12B are graphs illustrating effects on threshold voltage (Vt) distribution for a program and erased state of a single multibit memory cell when operated using multiple charge-trapping locations to store a single bit at a maximum threshold voltage and a minimum threshold voltage Vt, respectively.
Figure 12B:
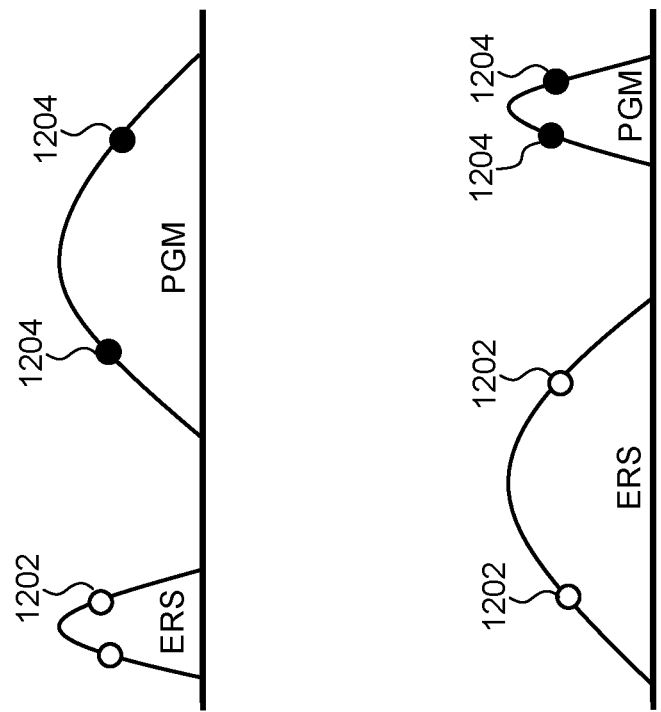

FIGS. 12A and 12B are graphs illustrating effects on threshold voltage (Vt) distribution for a program and erased state of a single multibit memory cell when operated using multiple charge-trapping locations to store a single bit at a maximum and a minimum Vt, respectively. Referring to FIG. 12A open circles 1202 show the Vt distribution for two erased bits in separate locations of a shared charge-trapping layer of a multibit memory cell. Filled circles 1204 show the Vt distribution for two programed bits in separate locations of the same shared charge-trapping layer of the multibit memory cell. Referring to FIG. 12A, it is noted that where the programmed distribution is wider than the erased distribution, a statistically wider window (indicated by arrow 1206) between the erased and programmed state can be realized by using a predetermined maximum Vt to read the multibit memory cell, thereby improving reliability.

Referring to FIG. 12B, alternatively where erased distribution is known to be wider than the programmed distribution, a statistically wider window (indicated by arrow 1208) between the erased and programmed state can be realized by using a predetermined minimum Vt to read the multibit memory cell, thereby improving reliability.

If erased and programmed distributions are comparable, either the maximum Vt or the minimum Vt can be used to read the multibit memory cell.

FIG. 13 is a graph of simulated narrow erased and wide programmed distributions of a number of multibit memory cells operated using a conventional 1BPC sensing approach in which the same bit value is stored in both data and non-data bits, but only a single data bit location in the charge-trapping layer is used to read one bit of data stored in the multibit memory cell. Referring to FIG. 13 open circles 1302 fit to curve 1304 represent Vts of erased multibit memory cells read using the conventional 1BPC sensing approach, and filled circles 1306 fit to curve 1308 represent Vts of programmed multibit memory cells.

Figure 14:
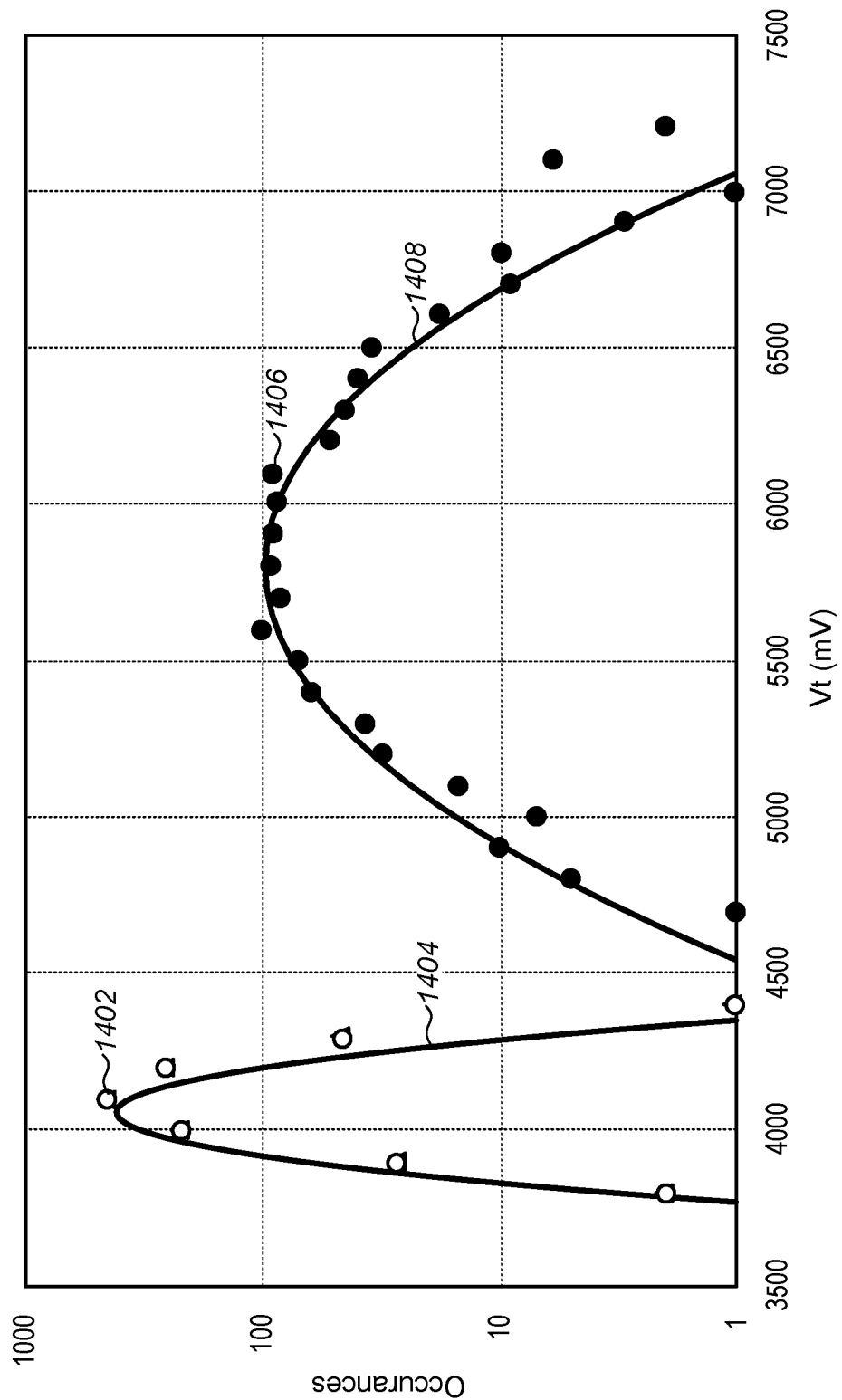
FIG. 14 is a graph of simulated erased and programmed distributions of a number of multibit memory cells operated in using a minimum or maximum (min-max) Vt to store and sense or read one bit per cell.

FIG. 14 is a graph of simulated narrow erased and wide programmed threshold voltage distributions of a number of multibit memory cells operated using a minimum Vt or maximum Vt (min-max) sensing approach in accordance with exemplary embodiments of the present disclosure. The embodiment shown in FIG. 14 uses a maximum Vt approach since the erase distribution is narrower. In particular, open circles 1402 fit to curve 1404 represent Vts of erased multibit memory cells read using the min-max Vt sensing approach, and filled circles 1406 fit to curve 1408 represent Vts of programmed multibit memory cells.

Referring to FIGS. 13 and 14 it is noted that as shown in FIG. 13 using the conventional 1BPC sensing approach, yields a negative statistical window, i.e., that is the Vts of erased and programmed multibit memory cells overlap as indicated by ellipse 1310, as compared to using a min-max Vt sensing approach with a maximum Vt as shown in FIG. 14.

Figure 15:
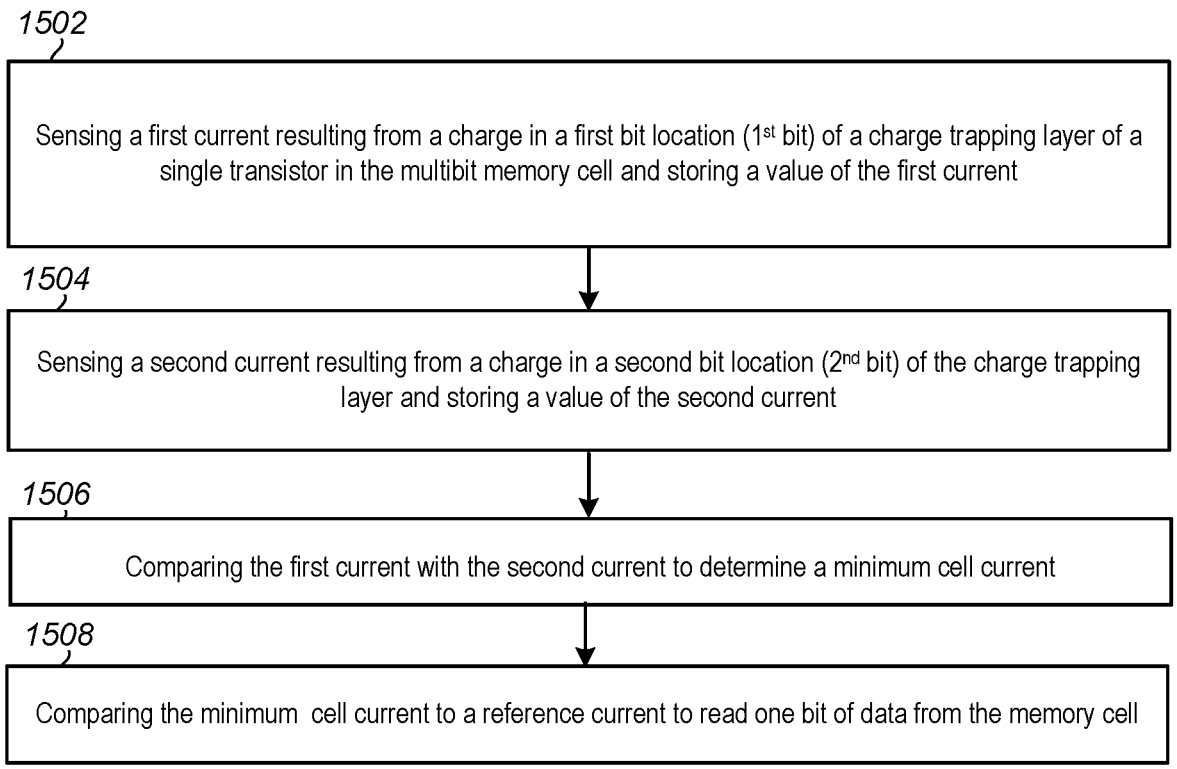
FIG. 15 is a flowchart illustrating a method of operating a multibit memory device in a maximum (Max) Vt sensing approach using multiple charge-trapping locations to store one bit per cell in accordance with an exemplary algorithm of the present disclosure.
Figure 16:
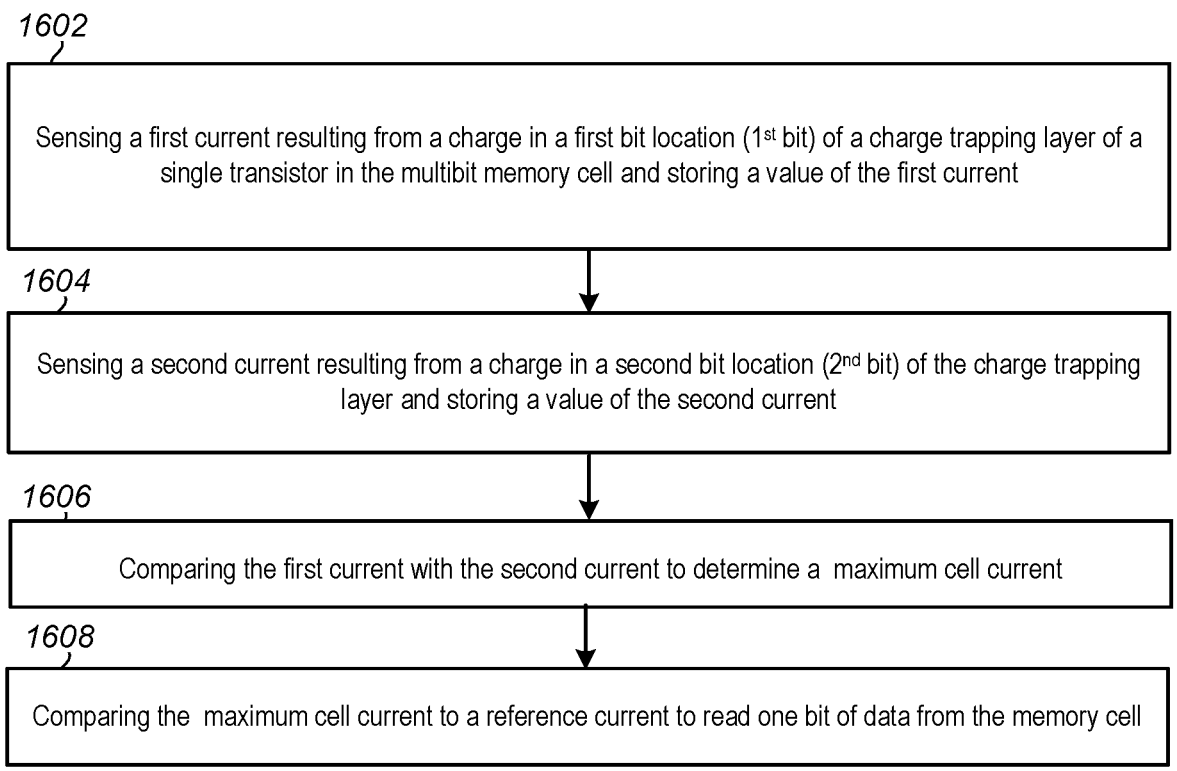
FIG. 16 is a flowchart illustrating a method of operating a multibit memory device in a minimum (Min) Vt sensing approach using multiple charge-trapping locations to store one bit per cell in accordance with an exemplary algorithm of the present disclosure.

FIGS. 15 and 16 are flowcharts illustrating algorithms and methods of operating a memory device including multibit memory cells using either a maximum (Max) Vt sensing approach or a minimum Vt sensing approach. Briefly, the decision to use either the Max Vt or the Min Vt approach is determined a-priori by early characterization of the multibit memory cell(s) of the memory device. For example, if the 'erased' Vt distribution for the bits of the cell is narrower than the 'programmed' Vt distribution, as shown in the left side of FIG. 12A, a Max Vt sensing approach is used, in which bit 1 and bit 2 are sensed taking the higher Vt result as output for the cell. Conversely, if the 'programmed' Vt distribution for the bits of the cell is narrower than the 'erased' Vt distribution, as shown in the right side of FIG. 12B, a Min Vt sensing approach is used, in which bit 1 and bit 2 are sensed taking the lower Vt result as output for the cell.

FIG. 15 illustrates an embodiment of a method of operating using the Max Vt sensing approach. Referring to FIG. 15 the method begins with sensing a first current resulting from an amount of charge in a first bit location ($1^{st}$ bit) of a charge-trapping layer of a single transistor in the multibit memory cell and storing a value of the first current (1502). The memory device is then operated to sense a second current resulting from an amount of charge in a second bit location ($2^{nd}$ bit) in the charge-trapping layer of the single transistor in the multibit memory cell and storing a value of the second current (1504). Next, the first current is compared with the second current to determine a minimum cell current, which results from or is generated using the predetermined maximum Vt) (1506). Finally, the minimum cell current is compared to a reference current to read one bit of data from the multibit memory cell (1508).

As with the sensing approaches described above, the sensing of the first and second currents, comparing the minimum cell current to the reference current during the subsequent read operations can be accomplished using a processor in the control-circuitry to sequentially sense and store the first and second currents, determine the minimum cell current and to compare the minimum cell current to the reference current to read the cell.

Alternatively, the control-circuitry may further include a current-to-voltage (I-V) converter, a number of capacitors coupled to the I-V converter, at least a first comparator coupled to the capacitors to determine the lower current between the $1^{st}$ and $2^{nd}$ bits which is related to the minimum cell current, by comparing both bits I-V voltage conversion, and a second comparator coupled to a voltage selector which is controlled by the first comparator (which decides which of the bit's current is lower), and to the reference current to compare the minimum current bit I-V converted voltage to a reference voltage (which is also an I-V converted voltage) to read the cell data.

FIG. 16 illustrates an embodiment of a method of operating using the Min Vt sensing approach. Referring to FIG. 16 the method begins with sensing a first current resulting from an amount of charge in a first bit location ($1^{st}$ bit) of a charge-trapping layer of a single transistor in the multibit memory cell and storing a value of the first current (1602). The memory device is then operated to sense a second current resulting from an amount of charge in a second bit location ($2^{nd}$ bit) in the charge-trapping layer of the single transistor in the multibit memory cell, and storing a value of the second current (1604). Next, the first current is compared with the second current to determine a maximum cell current (Minimum Vt) (1606). Finally, the maximum cell current is compared to a reference current to read one bit of data from the multibit memory cell (1608).

Thus, multibit memory devices and methods for operating the same method of operating the same to provide high reliability and improved data retention, have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

In particular, it is noted that the multibit cells may include multi-level storage cells (MLC) in which each single physical bit in separate locations of the shared charge trapping layer may be programmable to different states or levels by altering the threshold voltage ($V_t$) to represent an analog stored weight value.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections can set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A memory device comprising:
    an array of multibit memory cells, each multibit memory cell operable to store bit values for multiple physical bits in separate bit locations in a shared charge-trapping layer of a single transistor in the multibit memory cell; and
    control-circuitry coupled to the array of multibit memory cells, the control-circuitry operable to:
        sequentially sense a first bit value and a second bit value from one multibit memory cell based on a first current and a second current sensed from the one multibit memory cell, wherein the first current and the second current correspond to charge trapped in first bit location and second bit location respectively;
        execute an algorithm on the first current and the second current, including:
            sense and store the first and second current;
            compare the first current to the second current to obtain a cell current; and
            compare the cell current to a reference current to determine the logic state of the one multibit memory cell, wherein the cell current is a maximum cell current which is generated by applying a predetermined minimum threshold voltage to the transistor in the multibit memory cell, and wherein to compare the cell current to the reference current the maximum cell current is compared to the reference current to determine the logic state of the one multibit memory cell; and
        determine based on a result of the algorithm a logic state of the one multibit memory cell.

2. The memory device of claim 1 wherein the control-circuitry comprises:
    a current-to-voltage (I-V) converter operable to convert the first current to a first voltage, and a second current to a second voltage;
    a number of capacitors coupled to the I-V converter including at least a first capacitor operable to store the first voltage and a second capacitor operable to store the second voltage;
    an averaging circuit coupled to the number of capacitors and operable to output an average cell voltage based on the first voltage and the second voltage; and a comparator coupled to the averaging circuit operable to compare the average cell voltage to a reference voltage to determine the logic state of the one multibit memory cell.

3. The memory device of claim 1, wherein erased distribution of threshold voltages of the multibit memory cells is wider than programmed distribution of the threshold voltages of the multibit memory cells.

4. The memory device of claim 1, wherein the shared charge-trapping layer includes a nitride layer.

5. A memory device comprising:
an array of multibit memory cells, each multibit memory cell operable to store bit values for multiple physical bits in separate bit locations in a shared charge-trapping layer of a single transistor in the multibit memory cell; and
control-circuitry coupled to the array of multibit memory cells, the control-circuitry operable to:
sequentially sense a first bit value and a second bit value from one multibit memory cell based on a first current and a second current sensed from the one multibit memory cell, wherein the first current and the second current correspond to charge trapped in first bit location and second bit location respectively;
execute an algorithm on the first current and the second current, including:
sense and store the first and second current;
compare the first current to the second current to obtain a cell current; and
compare the cell current to a reference current to determine the logic state of the one multibit memory cell, wherein the cell current is a minimum cell current which is generated by applying a predetermined maximum threshold voltage to the transistor in the multibit memory cell and wherein comparing the cell current to the reference current comprises comparing the minimum cell current to the reference current to determine the logic state of the one multibit memory cell; and
determine based on a result of the algorithm a logic state of the one multibit memory cell.

6. The memory device of claim 5, wherein the control-circuitry comprises:
a current-to-voltage (I-V) converter operable to convert the first current to a first voltage, and a second current to a second voltage;
a number of capacitors coupled to the I-V converter including at least a first capacitor operable to store the first voltage and a second capacitor operable to store the second voltage;
an averaging circuit coupled to the number of capacitors and operable to output an average cell voltage based on the first voltage and the second voltage; and
a comparator coupled to the averaging circuit operable to compare the average cell voltage to a reference voltage to determine the logic state of the one multibit memory cell.

7. The memory device of claim 5, wherein the shared charge-trapping layer includes a nitride layer.

8. The memory device of claim 5, wherein programmed distribution of threshold voltages of the multibit memory cells is wider than erased distribution of the threshold voltages of the multibit memory cells.

\* \* \* \* \*